(12) United States Patent
Kouchi et al.

(10) Patent No.: US 7,058,863 B2
(45) Date of Patent: Jun. 6, 2006

(54) SEMICONDUCTOR INTEGRATED CIRCUIT

(75) Inventors: Toshiyuki Kouchi, Nishitokyo (JP); Makoto Takahashi, Yokohama (JP); Kenji Numata, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 508 days.

(21) Appl. No.: 10/131,194

(22) Filed: Apr. 25, 2002

(65) Prior Publication Data

US 2002/0158271 A1    Oct. 31, 2002

(30) Foreign Application Priority Data

Apr. 26, 2001    (JP) .............................. 2001-130076

(51) Int. Cl.
G11C 29/00    (2006.01)

(52) U.S. Cl. ...................... 714/718; 714/733; 365/201

(58) Field of Classification Search ................ 714/716, 714/740, 718, 732, 733, 734, 736, 742, 25, 714/30; 716/12
See application file for complete search history.

(56) References Cited

U.S. PATENT DOCUMENTS

| 5,308,798 | A | * | 5/1994 | Brasen et al. ................ 438/129 |
| 5,450,364 | A | * | 9/1995 | Stephens et al. ............ 365/222 |
| 5,825,783 | A | * | 10/1998 | Momohara ................... 714/718 |
| 5,910,181 | A | * | 6/1999 | Hatakenaka et al. ........ 714/718 |
| 6,046,957 | A | * | 4/2000 | Shyu ...................... 365/230.06 |
| 6,052,806 | A | * | 4/2000 | Beat ........................... 714/718 |
| 6,173,356 | B1 | * | 1/2001 | Rao ................................ 711/5 |
| 6,182,253 | B1 | * | 1/2001 | Lawrence et al. .......... 714/718 |
| 6,260,127 | B1 | * | 7/2001 | Olarig et al. ............... 711/167 |
| 6,405,358 | B1 | * | 6/2002 | Nuber ......................... 716/12 |
| 6,446,159 | B1 | * | 9/2002 | Kai et al. .................... 711/106 |
| 6,467,056 | B1 | * | 10/2002 | Satou et al. ................. 714/720 |
| 6,543,039 | B1 | * | 4/2003 | Watanabe ...................... 716/7 |
| 6,553,526 | B1 | * | 4/2003 | Shephard, III .............. 714/733 |
| 6,813,599 | B1 | * | 11/2004 | Court et al. .................. 703/14 |
| 6,829,728 | B1 | * | 12/2004 | Cheng et al. ................. 714/30 |

FOREIGN PATENT DOCUMENTS

| CN | 1163475 | 10/1997 |
| CN | 1234901 | 11/1999 |
| JP | 9-145790 | 6/1997 |
| JP | 10-302476 | 11/1998 |

OTHER PUBLICATIONS

"Merged DRAM-Logic in the Year 2001", Diodato et al., Aug. 24-25, 1998, Memory Workshop, Design and Testing, 1998 IEEE, pp. 24-30.*

* cited by examiner

*Primary Examiner*—Albert Decady
*Assistant Examiner*—John P. Trimmings
(74) *Attorney, Agent, or Firm*—Oblon, Spivak, McClelland, Maier & Neustadt, P.C.

(57) ABSTRACT

A semiconductor integrated circuit including a region of a memory macro function block is divided into memory core function block and interface function block regions. The interface function block includes a test circuit, a command decoder for a test, an address decoder for the test, a memory core input/output circuit which inputs a command and address into the memory core function block and transmits!receives data with the memory core function block, a configuration memory block in which information of a memory capacity of the memory core function block and configuration of a memory core is stored, and a configuration memory block which controls a data path and address path of the memory core function block based on the stored information.

17 Claims, 7 Drawing Sheets

| 12 | 11 | 10 | 9 | 8 | 7 | 6 | 5 | 4 | 3 | 2 | 1 | 0 | Signal name |
|---|---|---|---|---|---|---|---|---|---|---|---|---|---|
|  |  |  |  |  |  |  |  |  | C | C | 1 |  | BNKADD<2:0> |
|  |  |  |  |  |  |  |  |  | 0 | 0 | 1 |  | BNKMSK<2:0> |
| C | 1 | 1 | 1 | 1 | 1 | 1 | 1 | 1 | 1 | 1 | 1 | 1 | ROWADD<12:0> |
| 0 | 1 | 1 |  |  |  |  |  |  |  |  |  |  | ROWMSK<12:10> |
|  |  |  |  |  | C | C | 1 | 1 | 1 | 1 | 1 | 1 | COLADD<6:0> |
|  |  |  |  |  | 0 | 0 | 1 |  |  |  |  |  | COLMSK<6:4> |
 Usable bit in address configuration
 Validation bit for used bit
 Unusable bit under mask signal
 Masking bit for unused bit
FIG. 3
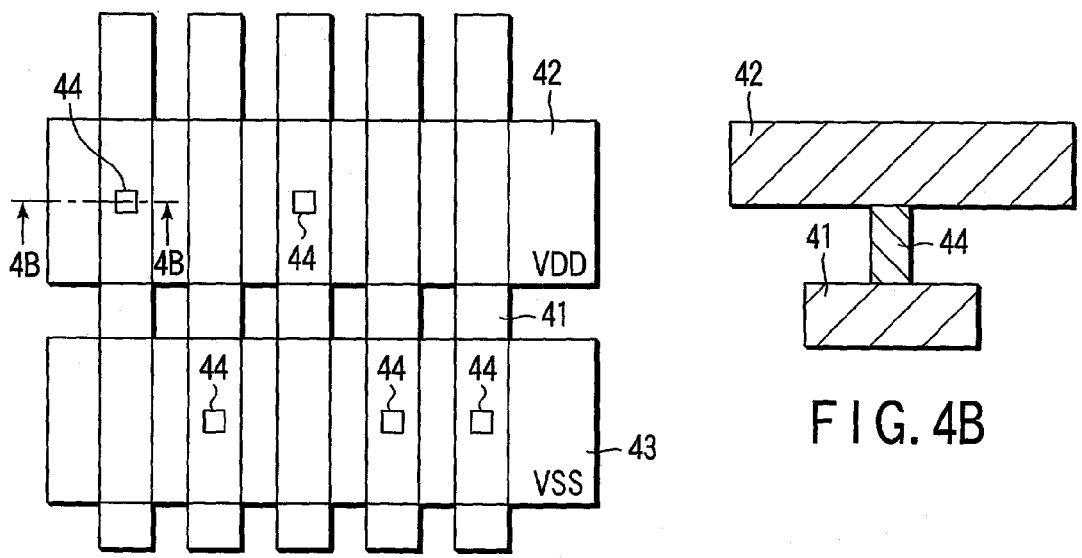
FIG. 4A
FIG. 4B

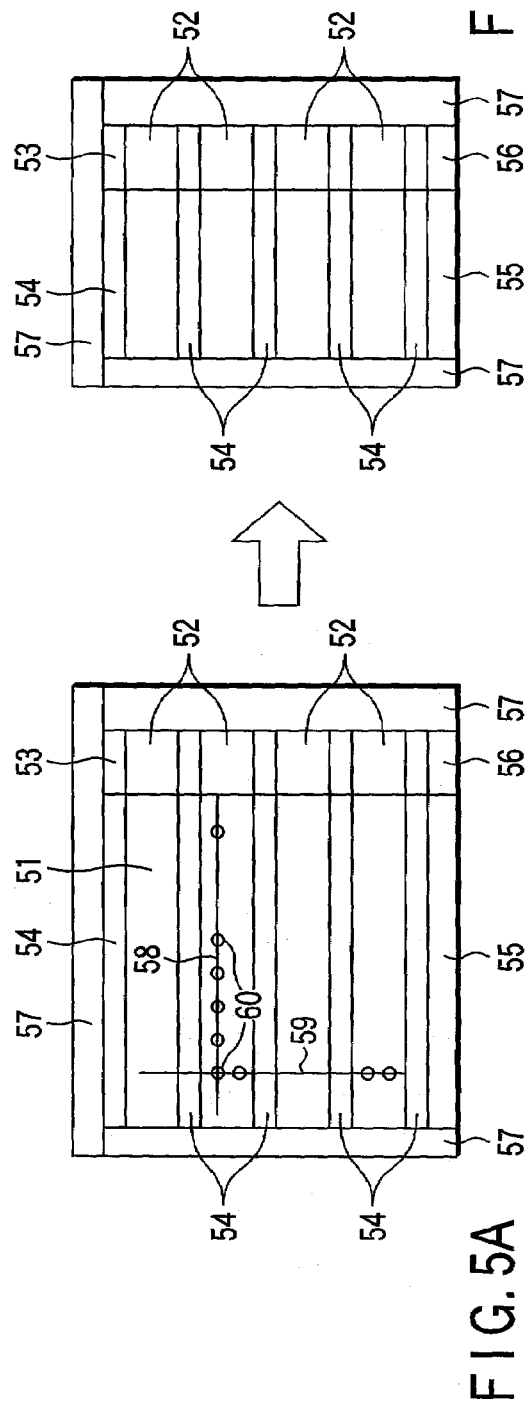
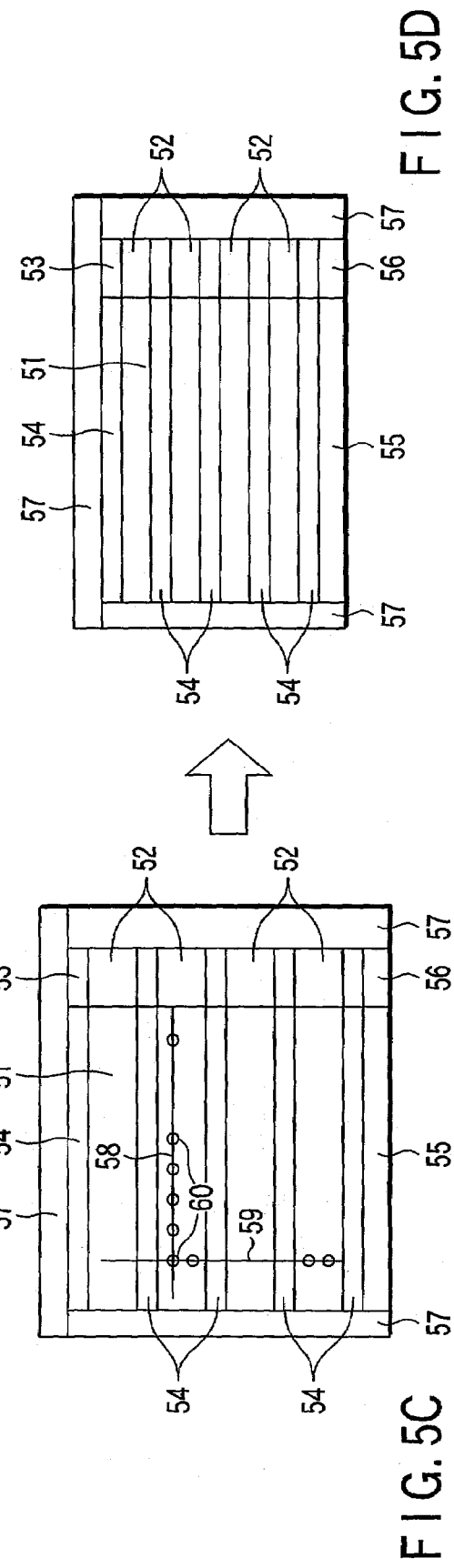

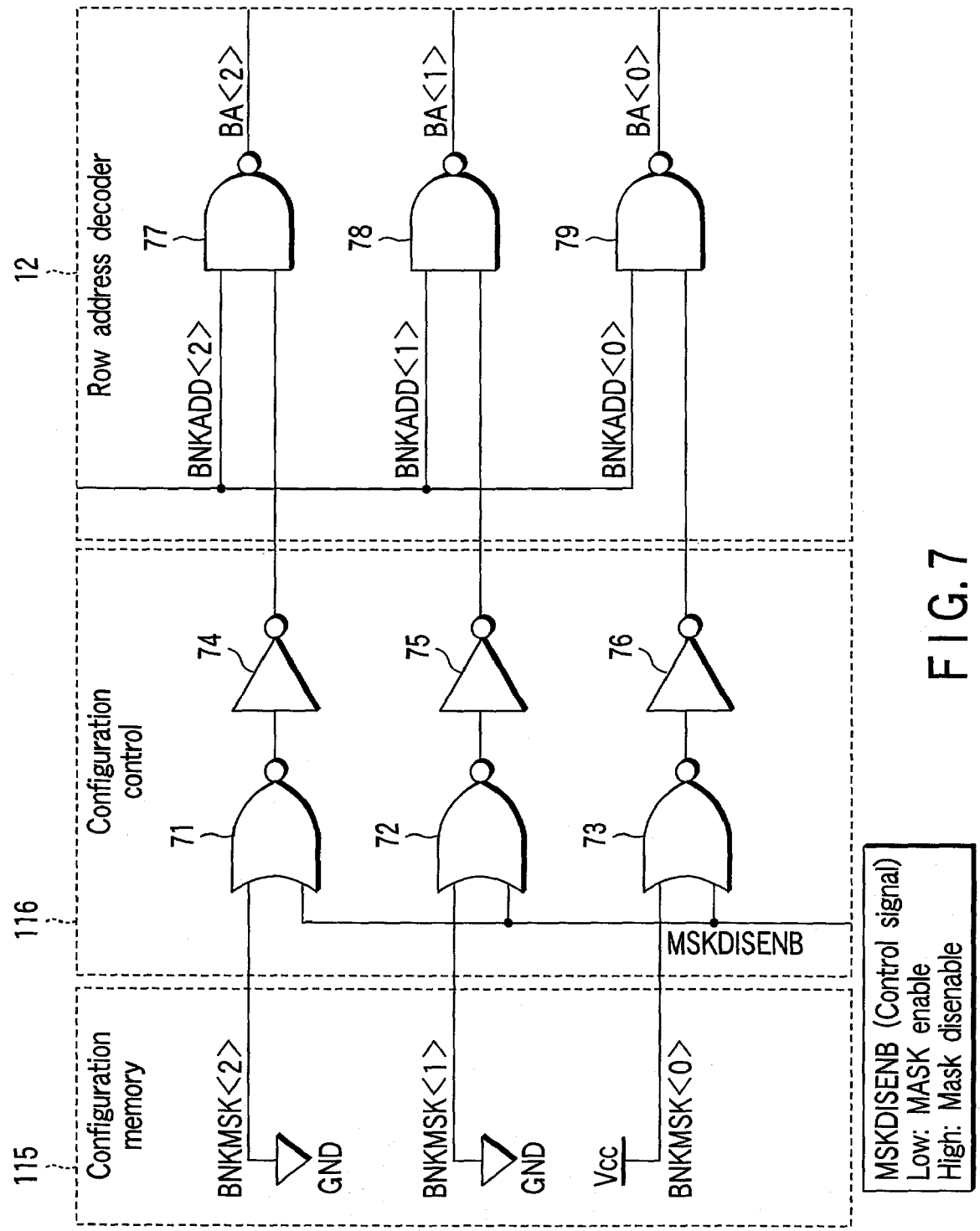
F I G. 7

SEMICONDUCTOR INTEGRATED CIRCUIT

CROSS-REFERENCE TO RELATED APPLICATIONS

This application is based upon and claims the benefit of priority from the prior Japanese Patent Application No. 2001-130076, filed Apr. 26, 2001, the entire contents of which are incorporated herein by reference.

BACKGROUND OF THE INVENTION

1. Field of the Invention

The present invention relates to a semiconductor integrated circuit apparatus (LSI) in which a memory macro function block and peripheral circuit are disposed on the same semiconductor chip in a mixed manner, particularly to a circuit which facilitates the changing of the memory macro function block and which is used for LSI for a specific application, and the like.

2. Description of the Related Art

A logic LSI and memory LSI were separately used conventionally, but, in recent years, owing to progress in semiconductor processing techniques both LSIs have been formed into one chip, producing a memory mixed logic LSI. In this case, there is a dynamic random access memory (DRAM) mixed/loaded LSI in which a memory macro function block is mixed and loaded on the same chip as a logic circuit portion, analog circuit portion, and input/output circuit portion.

The memory macro function block includes a memory core function block, a test circuit for testing a function of the memory core function block, a command decoder which decodes commands sent from the outside of the macro function block (e.g. the user logic side), an address decoder, and a memory core input/output circuit.

In the conventional DRAM mixed LSI, the whole memory macro function block has been handled as one block. Moreover, a design is changed to such an extent that the configuration is a little changed. For example, when a bit capacity of the memory is changed, a memory wiring layer is re-connected.

However, when the function of the memory macro function block is changed to a static random access memory (SRAM) from a synchronous dynamic random access memory (SDRAM), the design has to be largely altered. For example, the whole memory macro function block is re-designed.

Moreover, the inside of the memory macro function block is divided into two. For example, the length of a word line in the memory macro function block is halved so as to raise the speed. When a dimensional change is required in this manner, not only the memory core function block but also the whole memory macro function block has to be redesigned.

Therefore, there has been a demand for realization of a semiconductor integrated circuit in which a memory macro function block is loaded in a mixed manner and which can easily be adapted for the changes of a command configuration, address configuration, input/output configuration, and the like without any design change.

BRIEF SUMMARY OF THE INVENTION

According to one aspect of the present invention, there is provided a semiconductor integrated circuit comprising:

a memory macro function block having a function for reading/writing data; and a peripheral circuit having a function different from the function of the memory macro function block, the memory macro function block comprising:

a memory core function block which decodes respective addresses of a plurality of bit cells constituted on a memory cell array and reads/writes bit cell data; and an interface function block, a region of which is separated from a region of the memory core function block and which transmits/receives data with the peripheral circuit, the interface function block comprising:

a test circuit which controls a function test of the memory core function block;

a command decoder portion which decodes an input command for the function test of the memory core function block;

an address decoder portion which decodes an input address for the function test of the memory core function block;

a memory core input/output circuit which inputs the command and the address into the memory core function block and which transmits/receives data with the memory core function block;

a configuration memory block in which data of a memory core configuration including a memory capacity, a command configuration, an address configuration, and an input/output configuration of the memory core function block is stored; and a configuration control block which controls a data path and an address path of the memory core function block based on stored information of the configuration memory block and which controls the memory core function block in a desired configuration.

BRIEF DESCRIPTION OF THE SEVERAL VIEWS OF THE DRAWING

FIG. 3 is a diagram showing one example of an address signal or a mask signal for controlling an address configuration of the memory core function block in FIG. 2.

FIG. 4A is a plan view showing one example of a configuration of a configuration memory block in FIG. 2.

FIG. 4B is a sectional view along a line 4B—4B in FIG. 4A.

FIGS. 5A and 5B are layout diagrams showing a modification example of the length of a word line in the memory core function block in FIG. 1.

FIGS. 5C and 5D are layout diagrams showing the modification example of the length of a bit line in the memory core function block in FIG. 1.

FIG. 7 is a circuit diagram showing each portion of the configuration memory block and configuration control block together with one portion of a row address decoder of the memory core function block in FIG. 2.

DETAILED DESCRIPTION OF THE INVENTION

Embodiments of the present invention will be described hereinafter in detail with reference to the drawings.

First Embodiment

Figure 1:
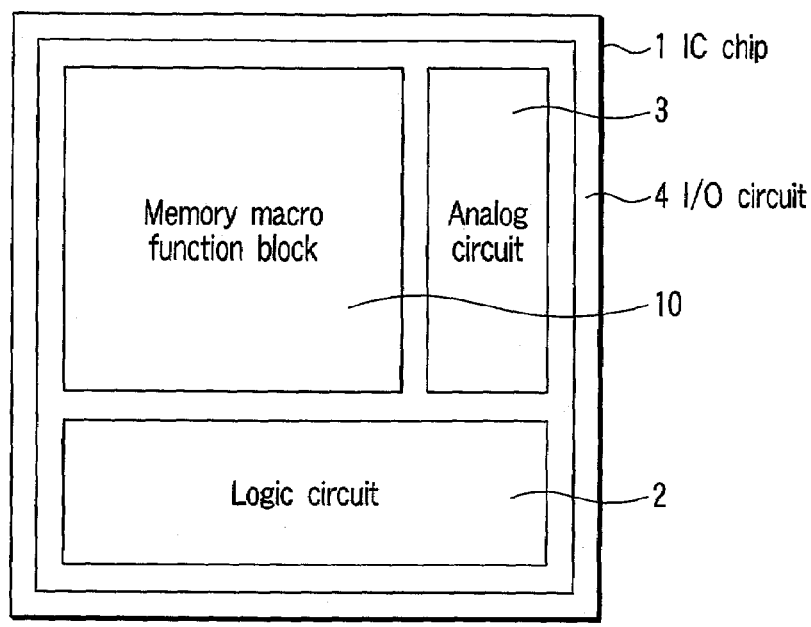
FIG. 1 is a top view showing a layout of a chip of a memory macro function block mounted LSI according to a first embodiment of the present invention.

FIG. 1 shows one example of a layout of a chip of a memory macro function block mounted LSI according to a first embodiment of the present invention. A memory macro function block 10 is disposed together with other peripheral circuits (logic circuit 2, analog circuit 3, and input/output circuit 4) on a chip 1.

Figure 2:
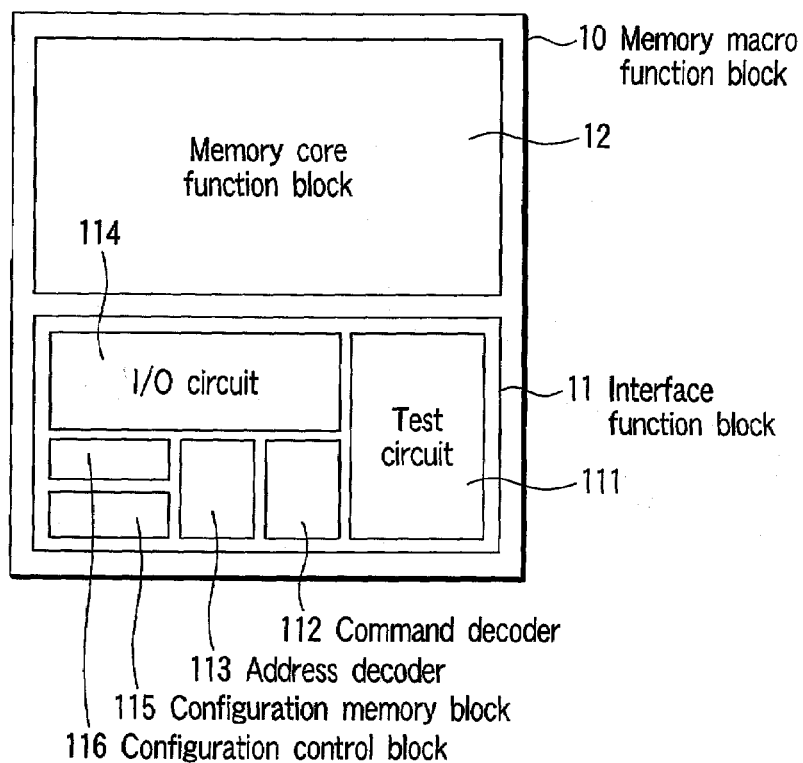
FIG. 2 is a top view showing the layout of the inside of a memory macro function block in FIG. 1.

FIG. 2 shows one example of the layout of the memory macro function block 10 in FIG. 1. The memory macro function block 10 includes: a memory core function block 12 which receives a WRITE/READ signal and can perform a read/write operation; and an interface function block 11 which interfaces with respect to a signal between the memory core function block 12 and other circuits and also transmits/receives the signal with the memory core function block 12.

The interface function block 11 includes a test circuit 111, command decoder portion 112, address decoder 113, memory core input/output circuit 114, configuration memory block 115, and configuration control block 116.

The test circuit 111 controls a function test of the memory core function block 12 based on a test control signal inputted from the outside during the function test of the system, and outputs the test result to the outside.

The command decoder 112 selects a command for the test/command for a usual operation to be inputted from the outside during the test/usual operation, and decodes and outputs the command.

The address decoder 113 selects an address for the test/address for the usual operation to be inputted from the outside during the test/usual operation, and decodes and outputs the address.

The memory core input/output circuit 114 has a function for inputting the command and address in the memory core function block 12, and a function for transmitting/receiving data with the memory core function block 12.

The configuration memory block 115 stores information of a configuration of a memory core including a memory capacity, command configuration, address configuration, and input/output (data bus width) configuration of the memory core function block 12. That is, the configuration memory block 115 has a function of storing the command configuration, address configuration, and input/output configuration, respectively.

The configuration control block 116 controls a data path and address path of the memory core function block 12 based on the stored information of the configuration memory block 115, and controls the memory core function block 12 in a desired configuration. That is, the configuration control block 116 has a function of controlling the command configuration, address configuration, and input/output configuration, respectively.

Additionally, the test control function of the test circuit 111 includes: (1) a function for carrying out a test of the basic function/capability of the memory core function block 12; (2) a function for checking the level of a voltage generated inside the memory core function block 12 (such as a word line boosted voltage); a function for searching for the address of a defective bit in a memory cell array of the memory core function block 12.

One example of the address configuration of the memory core function block 12 includes: a 3-bits signal BNKADD<2:0> with which banks 1 to 8 can be selected/designated as a bank address; a 13-bits signal ROW-ADD<12:0> with which 1K (=1024 bits) to 8K at a maximum width can be selected/designated as a row address; a 7-bits signal COLADD<6:0> with which 16 to 128 at the maximum width can be selected/designated as a column address; and a 1-bit signal DBUS<0> with which two data bus widths of 64 bits and 128 bits can be selected/designated as a data bus width designation signal.

In this case, an address mask signal indicating a change of variation allowed in the configuration includes, for example, 3 bits of BNKMSK<2:0> as a bank address mask signal, 3 bits of ROWMSK<12:10> as a row address mask signal, 3 bits of COLMSK<6:4> as a column address mask signal, and the like. The address mask signal designates an effective address bit for controlling an address configuration (bit for validating an address bit for use) and ineffective address bit (bit for masking an unusable address bit), and the effective address bit/ineffective address bit is represented, for example, by "1"/"0" data.

FIG. 3 shows one example of the address mask signal for one example of variation of the configuration of the memory core function block 12 in FIG. 2.

That is, assuming that the address configuration of the memory core function block includes, for example, 2 banks, 4K row address, and 32 columns address, the address for use includes 1 bit of BNKADD<0> as a bank address, 12 bits of ROWADD<11:0> as a row address, and 5 bits of COLADD<4:0> as a column address, and satisfies a necessary/sufficient range.

In this case, the mask signal of the bank address BNKMSK<2:0>=<0,0,1>, the mask signal of the row address ROWMSK<12:10>=<0,1,1>, and the mask signal of the column address COLMSK<6:4>=<0,0,1>.

Moreover, the address mask signals are stored in the configuration memory block 115, and the configuration control block 116 can be constructed to change the configuration of the memory core function block 12 based on the stored content.

Therefore, upon a change of address allocation due to the change of the configuration of the memory core function block 12, the stored content of the configuration memory block 115 of the interface function block is changed, and the stored content is inputted into the configuration control block 116, so that the change can be handled. In other words, according to the configurations of the memory core function blocks 12, the stored content of the configuration memory block 115 and the control content of the configuration control block 116 vary.

FIG. 4A is a plan view showing one example of the configuration of the configuration memory block 115 in FIG. 2, and FIG. 4B is a sectional view along line 4B—4B of FIG. 4A.

In the configuration memory block shown in FIGS. 4A and 4B, a metal power line (VDD) 42 or a metal ground line (GND) 43 as an upper layer is selectively connected to a metal wiring 41 as a lower layer via contacts 44, that is, metal wirings are selectively connected to one another (metal option) so that the address mask signal is stored/held.

Additionally, the configuration of the configuration memory block 115 is not limited to the above one as long as the address mask signal can be stored/held. Programmable elements (nonvolatile memory element, fuse element, and the like) other than the metal option can be used in the configuration memory block 115.

FIGS. 5A and 5B are layout diagrams showing a modification example of the configuration of the memory core function block 12 in FIG. 2.

In FIG. 5A, reference numeral 51 denotes a memory cell array in which, for example, DRAM cells are arranged in rows and columns; 52 denotes a row decoder region for selecting a word line from the memory cell array; 53 denotes a column decoder region for selecting a bit line from the memory cell array; 54 denotes a sense amplifier region; 55 denotes an input/output (I/O) buffer region; 56 denotes an address decoder region; 57 denotes a power source unit region; 58 denotes one example of the word line; 59 denotes one example of the bit line; and 60 denotes the memory cell (bit cell).

The memory core function block shown in FIG. 5A has 512 word lines (representatively shown by 58) connected in common to the memory cells (representatively shown by 60) of the same row in the memory cell array, and 2048 bit lines (representatively shown by 59) connected in common to the memory cells 60 of the same column in the memory cell array, and has a memory capacity of a 1M segment.

The memory core function block shown in FIG. 5B is configured by halving the length of the memory core function block shown in FIG. 5A in a word line extending direction, so that the block has a memory capacity of 512 word lines×1024 bit lines=0.5 M segment.

When the configuration of the memory core function block is changed in this manner, additional capacities such as a gate capacity and wirings are reduced, and a high-speed operation for a row access and the like can be realized.

To cope with the high speed of the memory core function block 12, in the interface function block 11, the control signal from the configuration memory block 115 or the test circuit 111 is so changed that a timing adjustment block in the configuration control block 116 can be properly adjusted.

FIGS. 5C and 5D are layout diagrams showing another modification example of the configuration of the memory core function block 12.

FIG. 5C is the same as FIG. 5A. The memory core function block shown in FIG. 5D is configured by halving the length of the memory core function block shown in FIG. 5C in a bit line extending direction, so that the block has a memory capacity of 256 word lines×2048 bit lines=0.5 M segment.

For example, if ROWMSK<2:0> in FIG. 3 is changed to ROWMSK<4:0> including two more bits, the minimum value of the row address changes to 256, and the mask signal copes with the row address ranging from 256 to 8K. This applies to the column address as well.

Figure 6:
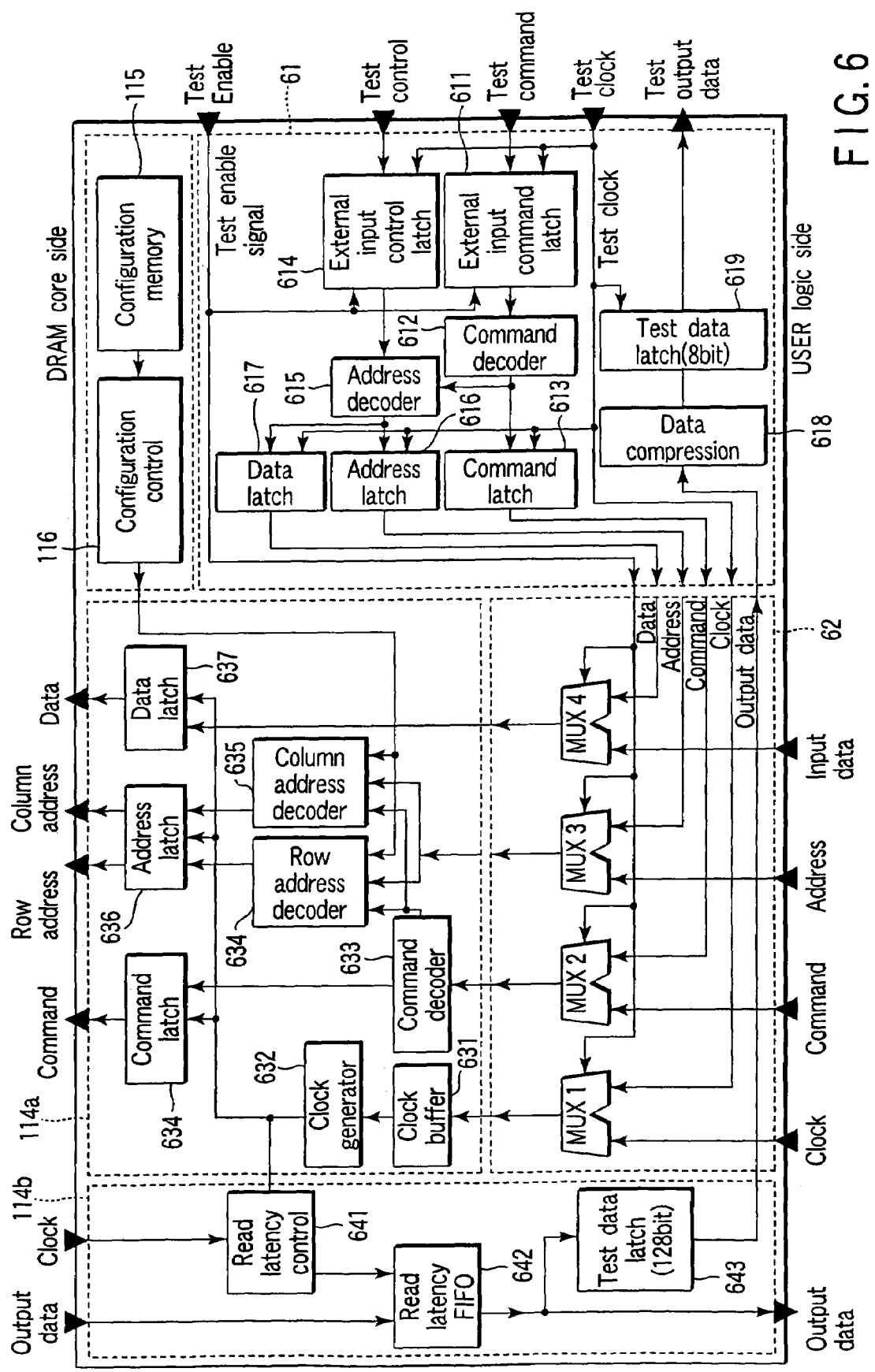
FIG. 6 shows one example of an interface function block in FIG. 2 realized using a design technique in which a circuit is described using a language of a register transfer level.
Figure 8A:
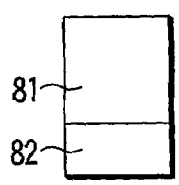
FIGS. 8A to 8H are diagrams showing various pattern region examples of the whole region of the memory macro function block in FIG. 1.
Figure 8B:
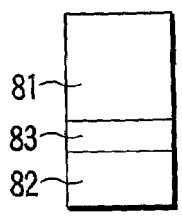
Figure 8C:
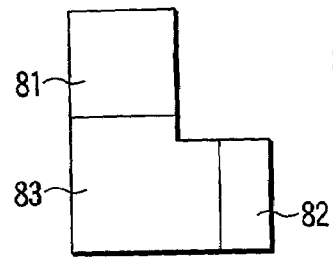
Figure 8D:
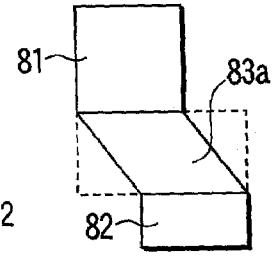
Figure 8E:
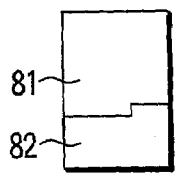
Figure 8F:
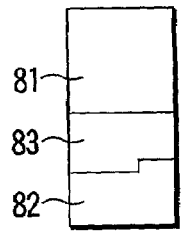
Figure 8G:
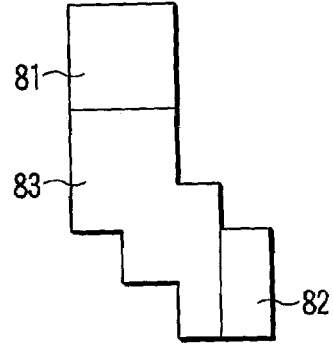
Figure 8H:
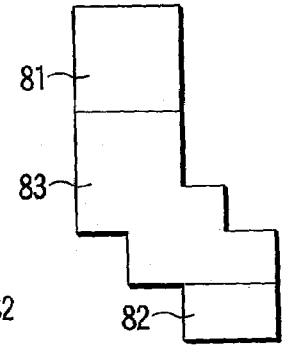

FIG. 6 is a diagram showing one example of a circuit only of the interface function block 11 (e.g., for DRAM core) in FIG. 2 realized using a design technique in which the circuit is described by a language of a register transfer level (RTL) as a generic concept of a level able to be logically synthesized (level which can be subjected to the logic synthesis by a top down design).

In the interface function block shown in FIG. 6, reference numeral 61 denotes a test-related circuit (including the test circuit, command decoder, and address decoder), 62 denotes a usual input/test switch circuit, 114*a* denotes a memory core input circuit, 114*b* denotes a memory core output circuit, 115 denotes a configuration memory block, and 116 denotes a configuration control block.

The test-related circuit 61 has the following functions.

(1) A test clock and test enable signal inputted from the outside (e.g., USER logic side, and the like) are passed through and inputted into the memory core input circuit 114*a*.

(2) A test command inputted from the outside is latched by an external input command latch circuit 611, decoded by a command decoder for a test 612, and latched by a command latch circuit for the test 613.

(3) A test control signal inputted from the outside is latched by an external input control latch circuit 614, and this controls a decode operation of an address decoder for the test 615.

(4) An address output/data output of the address decoder for the test 615 is latched by an address latch circuit 616/data latch circuit 617 for the test, and inputted in the memory core input circuit 114*a*.

(5) The data from the memory core output circuit 114*b* is inputted, compressed, for example, to 8 bits by a data compression circuit 618, latched by a test data latch circuit 619, and subsequently outputted as test output data to the outside.

The usual input/test input switch circuit 62 has the following functions.

(1) A clock for a usual operation inputted from the outside or a test clock inputted from the test system circuit 61 is selected by a first multiplexer MUX1.

(2) A command for the usual operation inputted from the outside or a command inputted from the test system circuit 61 is selected by a second multiplexer MUX2.

(3) An address for the usual operation inputted from the outside or the address inputted from the test system circuit 61 is selected by a third multiplexer MUX3.

(4) Data inputted from the outside or data inputted from the test system circuit 61 is selected by a fourth multiplexer MUX4.

The memory core input circuit 114*a* has the following functions.

(1) The clock selected by the first multiplexer MUX1 is inputted in a clock generator circuit 632 via a clock buffer 631, and a clock CL outputted from the clock generator circuit 632 is supplied to a required circuit described later.

(2) The command selected by the second multiplexer MUX2 is decoded by a command decoder 633, latched by the clock CL in a command latch circuit 634, and inputted into the memory core function block 12.

(3) The address selected by the third multiplexer MUX3 is decoded by the row address decoder 634 or a column address decoder 635 in accordance with the decode result of the command decoder 633, and this decode output is latched by the clock CL in an address latch circuit 636, and subsequently inputted in the memory core function block 12.

(4) The data selected by the fourth multiplexer MUX4 is latched by the clock CL in a data latch circuit 637, and subsequently inputted into the memory core function block 12.

The memory core output circuit 114b has the following functions.

The clock outputted from the memory core function block 12 is inputted into a read latency control circuit 641 in synchronization with the clock CL. The output data from the memory core function block 12 is inputted into a Read-Latency First In First Out (FIFO) 642 in synchronization with the output of the control circuit 641. The output data, for example, of 128 bits from the FIFO 642 is outputted to the outside, latched by a test data latch circuit 643, and inputted into the data compression circuit 618 of the test system circuit 61.

FIG. 7 is a circuit diagram showing each portion of the configuration memory block 115 and configuration control block 116 of FIG. 6 together with one portion of the row address decoder of the memory core function block 12 in FIG. 2.

Here, a portion corresponding to 3 bits of bank address BNKMSK<2:0> is extracted from the address mask signal stored in the configuration memory block 115, and the bank address mask signals BNKMSK<2> indicating "0"=GND, BNKMSK<1> indicating "0"=GND, and BNKMSK<0> indicating "1"=VCC are shown.

The configuration control block 116 includes three 2-input NOR circuits 71 to 73 for the bank address mask signal BNKMSK<2:0>, and is configured such that the block can be controlled by the test circuit, command decoder, and address decoder 61. That is, the bank address mask signal BNKMSK<2:0> is inputted into one input of each of the NOR circuits 71 to 73, and a mask disable/enable (MSK-DISENB) signal is inputted as the control signal into the other input from the test circuit 111. In this case, the MSKDISENB signal indicates "L"=GND during mask enable, and the MSKDISENB signal indicates "H"=VCC during mask disable. Moreover, the respective outputs of the NOR circuits 71 to 73 are reversed by inverter circuits 74 to 76 and outputted.

In the row address decoder of the memory core function block 12, three 2-inputs NAND circuits 77 to 79 are disposed for the bank address BNKMSK<2:0>. The output of each of the inverter circuits 74 to 76 of the configuration control block 116 is inputted into one input of each of the NAND circuits 77 to 79, and the bank address BNKADD<2:0> is inputted into the other input end.

Additionally, for the interface function block 11 shown in FIG. 6, since the circuit is designed using a generic concept, each included function block is not necessarily separated by the region, that is, they may be disposed in a mixed manner. Random logics other than the configuration memory block 115 are designed based on the circuit diagram of the interface function block 11 logically synthesized from the generic concept.

When random logic design is carried out, an automatically disposed wiring region has to be determined beforehand, and a region able to be linearly divided needs to be determined. For this, the interface function block 11 has to have a polygonal pattern constituted only of right angles, such as a rectangular pattern, and the memory core function block 12 has to be formed in the pattern. Here, examples of the polygonal pattern constituted only of right angles include all of the various patterns shown in FIGS. 8A to 8H.

FIGS. 8A to 8H show various pattern examples of the whole region of the memory macro function block 10 in FIG. 1. Here, reference numeral 81 denotes the pattern region of the interface function block 11, 82 denotes the pattern region of the memory core function block 12, and 83 denotes the wiring region, for example, of the power line and ground line.

In FIGS. 8A to 8H, even in an example in which the pattern region 81 of the interface function block 11 is obliquely connected to the pattern region 82 of the memory core function block 12 via a rhombic pattern region 83a, the pattern region of the whole memory macro function block 10 has a rectangular shape. Therefore, the rhombic pattern region 83a can be regarded as the rectangular shape as shown by a dotted line.

As described above, when the random logic of the interface function block 11 is designed, RTL design is used. Therefore, for example, even when the interface function block for the low-speed operation with a low power consumption or the interface function block for the high-speed operation is prepared, the block can easily be realized by performing the logic synthesis anew, and disposing the automatically disposed wiring.

Moreover, as described above with reference to FIGS. 4A and 4B, a process of using the contact for the address mask signal to connect the configuration memory block 115 to the power line can be realized by generating a contact pattern by a generator, or manually drawing the contact pattern.

Figure 9A:
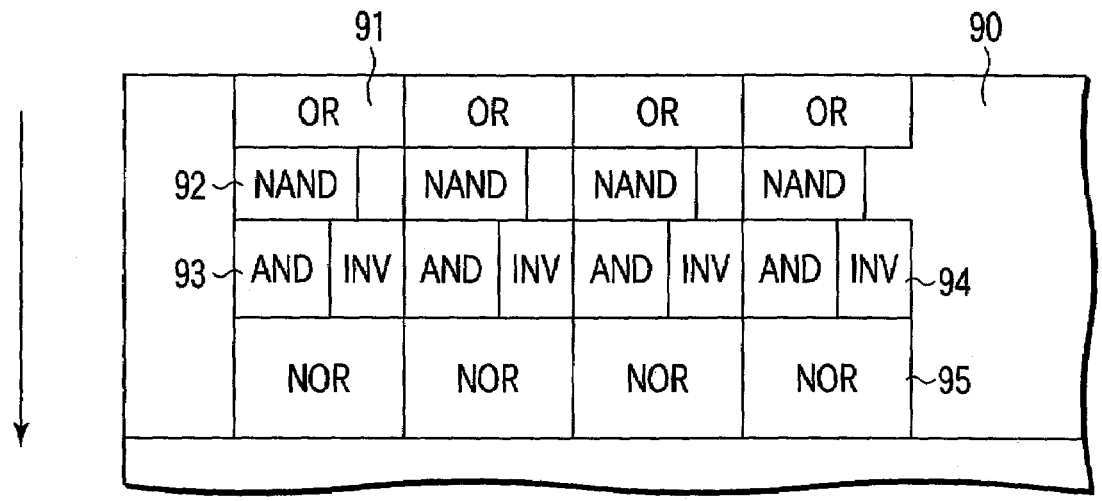
FIG. 9A is a diagram showing an arrangement example of a circuit unit according to a conventional design technique.

Here, visual characteristics of the pattern according to RTL design will be described. As shown in FIG. 9A, in a conventional manual design technique, circuit units 91 to 95 are arranged in a design region 90 in a stripe form, but a stripe width is not constant.

Figure 9B:
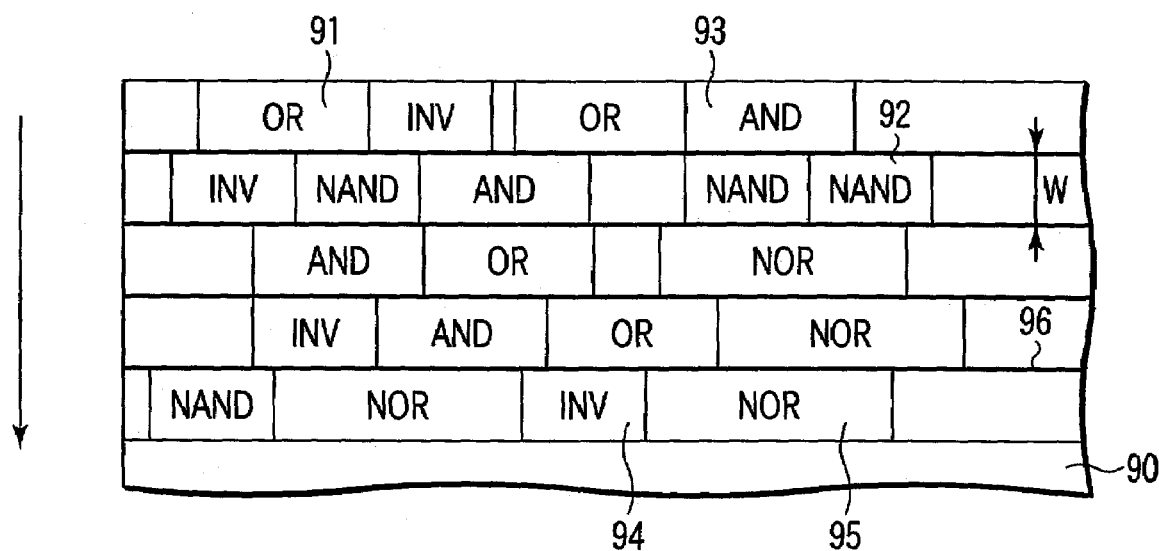
FIG. 9B is a diagram showing an arrangement example of the circuit unit according to the design technique of a register transfer level.

On the other hand, in RTL design, as shown in FIG. 9B, the circuit units 91 to 95 are formed in a striped automatic design region which has a substantially constant width w. For example, a power line 96 is disposed in a boundary of each stripe.

Additionally, in handwriting design, the pattern is designed with periodicity in many cases. However, since RTL design is a random logic design, there is substantially no periodicity. Moreover, an x-direction wiring layer and y-direction wiring layer are separately used in RTL design. However, since there is no such restriction in handwriting design, the x-direction and y-direction wiring layers are sometimes disposed in the same layer.

Second Embodiment

In the memory macro function block 10, the internal memory core function block 12 may be constituted of a DRAM, which necessarily requires a refresh operation, or SRAM, which does not require a refresh operation.

When the memory core function block 12 is a DRAM memory core function block, for example, as described above with reference to FIGS. 5A to 5D, it is possible to set the word line selected by the row address and the bit line selected by the column address to have an optional length.

However, when the memory core function block 12 needs to operate at a higher speed and, for example, the DRAM memory core function block is changed to the high-speed SRAM memory core function block, the command configuration and address configuration change. Therefore, when the region of the interface function block 11 is not separated (i.e., disposed in the mixed manner) in the memory macro function block 10, the interface function block 11 has to be re-designed.

To avoid redesigning the interface function block 11, the interface function block may be prepared in consideration of the configurations of both DRAM and SRAM. That is, the configurations of both DRAM and SRAM may be stored beforehand in the configuration control block 116, so that the configuration of the interface function block 11 can be determined by the configuration memory block 115.

In this case, when the memory macro function block 10 is used as the SRAM memory function macro, the memory core function block 12 may also be the DRAM memory core function block.

In this case, the interface function block 11 may include a circuit block which automatically performs the refresh operation as a characteristic operation of DRAM, that is, a circuit block in which a refresh control signal is automatically generated without receiving the refresh control signal from the outside of the memory macro function block.

Third Embodiment

The memory core function block 12 may be either a synchronous memory core function block (e.g., synchronous DRAM) which operates in synchronization with a clock signal, or an asynchronous memory core function block which operates a synchronously with the clock signal.

Figure 10:
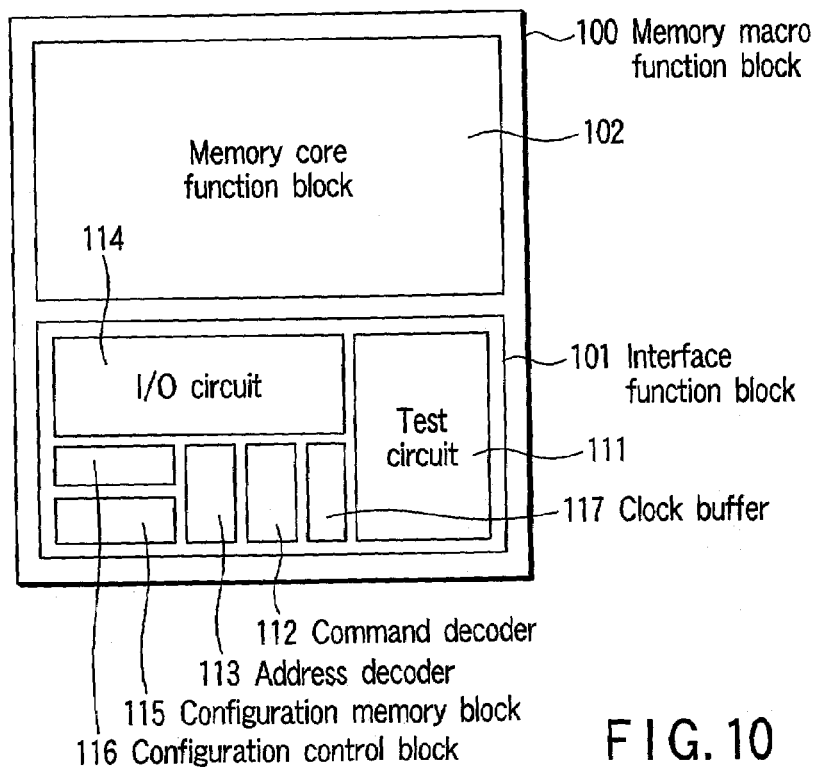
FIG. 10 is a layout diagram showing one example of the memory macro function block having an asynchronous memory core function block and an interface function block which operates in synchronization with a clock according to a third embodiment.

FIG. 10 is a layout diagram showing one example of a memory macro function block 100 having an asynchronous memory core function block 102 and an interface function block 101 which operates in synchronization with a clock according to the third embodiment.

In the memory macro function block 100 having the asynchronous memory core function block 102, the interface function block 101 includes the test circuit 111, command decoder 112, address decoder 113, memory core input/output circuit 114, configuration memory block 115, and configuration control block 116. The interface function block further includes a clock buffer 117 for buffering the clock signal inputted from the logic circuit outside the memory macro function block 100 in order to control the blocks, and has a function of the input/output with respect to the memory core function block 102 in synchronization with the clock signal.

In this case, in the configuration memory block 115, the memory capacity and core configuration (address configuration, command configuration, and input/output configuration) of the memory core function block 102 are stored. The configuration memory block further has a function of storing timing information of the memory core function block 102.

Moreover, in addition to the control function of the address signal, command signal, and input/output, the configuration control block 116 has a function for adjusting (controlling) the timing of the operation of the memory core function block 102.

Fourth Embodiment

When the DRAM is used as the memory core function block 12, the test time may largely be reduced by raising an activation ratio of the word line only during the testing of the row system without changing the configuration of the DRAM core.

In this case, the DRAM includes: a memory cell array in which DRAM cells are arranged in the rows and columns; a plurality of word lines connected in common to the memory cells of the same row in the memory cell array; a plurality of bit lines connected in common to the memory cells of the same column in the memory cell array; and a block selection circuit which outputs a block selection signal for dividing the memory cell array into a plurality of blocks and selecting the block in accordance with the content of a plurality of predetermined bits in the address signal.

The block in which the memory cell array is divided into the plurality of blocks corresponds, for example, to the memory cell array region 51 of FIGS. 5A to 5D. Moreover, the block selection circuit can be included in the address decoder 113 of FIGS. 2 and 10. Alternatively, a plurality of block selection circuits may be scattered and arranged.

Furthermore, the test circuit 111 has a function for controlling the block selection signal outputted from the block selection circuit (113) so that all the blocks of the memory cell array are brought into an activated state during the testing of the circuit of the row system of the memory cell array. Alter-natively, the test circuit may have a function for selecting (activating) at least some of the blocks of the memory cell array in the DRAM core and simultaneously selecting (activating) the plurality of word lines.

As described above, according to the memory macro function block mixed/loaded LSI of the present embodiment(s), since the configuration memory block and configuration control block are disposed, variation of the configuration of the memory macro function block can easily be handled.

Moreover, since the timing information of the memory core function block is stored in the configuration memory block, even a physical change of the bit capacity of the memory core function block can easily be handled.

Furthermore, when the configuration memory block and configuration control block are included in the interface function block, the memory macro function block can be formed of one block irrespective of the type (DRAM, SRAM, and the like) of the memory core function block.

Additionally, the minimum necessary function for the memory operation is imparted to the memory core function block, and the minimum necessary function for controlling the memory operation and interfacing with respect to the signal between the memory macro function block and the outside is imparted to the interface function block. As the function is divided in this manner, the memory macro function block can easily be adapted for a case in which the macro of the SDRAM type is necessary and a case in which the macro of the SRAM type is necessary.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a memory macro function block configured to read/write data; and
a peripheral circuit configured to function differently from said memory macro function block, wherein
said memory macro function block comprises,
a memory core function block configured to include one of a DRAM and an SRAM, to decode respective addresses of a plurality of bit cells constituted on a memory cell array, and to read/write bit cell data, and
an interface function block, a region of which is separated from a region of said memory core function block, configured to transmit/receive data with said peripheral circuit, wherein
said interface function block comprises,
a test circuit configured to control a function test of said memory core function block, a command decoder portion configured to decode an input command for said function test of said memory core function block, an address decoder portion configured to decode an input address for said function test of said memory core function block, a memory core input/output circuit configured to input said command and said address into said memory core function block and to transmit/receive data with said memory core function block, a configuration memory block configured to simultaneously store data of a memory core configuration including, a memory capacity, a command configuration, an address configuration, and an input/output configuration of said memory core function block dedicated to both of the DRAM and SRAM, and a configuration control block dedicated to both of the DRAM and SRAM, and configured to change a data path and an address path of said memory core function block based on stored information of said configuration memory block and to control said memory core function block in a desired configuration.

2. The semiconductor integrated circuit according to claim 1, wherein said memory core function block is configured to operate a synchronously with a clock signal, said interface function block further comprises a clock buffer configured to buffer said clock signal and to input/output data with said memory core function block in synchronization with said clock signal supplied from said clock buffer, and said configuration memory block is configured to adjust a timing of an operation of said memory core function block.

3. The semiconductor integrated circuit according to claim 1, wherein said configuration memory block comprises a plurality of programmable elements.

4. The semiconductor integrated circuit according to claim 3, wherein said configuration memory block includes an upper layer and a lower layer of metal wiring layers, and a plurality of contacts configured to connect said wiring layers to each other.

5. The semiconductor integrated circuit according to claim 1, wherein said configuration memory block is configured to store said command configuration, said address configuration, and said input/output configuration of said memory core function block.

6. The semiconductor integrated circuit according to claim 5, wherein said configuration memory block is further configured to store timing information of said memory core function block.

7. The semiconductor integrated circuit according to claim 1, wherein said configuration control block is configured to control said command configuration, said address configuration, and said input/output configuration.

8. The semiconductor integrated circuit according to claim 7, wherein a function of said configuration control block is controlled by said test circuit.

9. The semiconductor integrated circuit according to claim 1, wherein said interface function block comprises a plurality of configuration circuit units formed in a plurality of striped wiring regions which are disposed adjacent to one another and which have a constant width.

10. The semiconductor integrated circuit according to claim 9, further comprising: a plurality of power lines formed among said plurality of wiring regions.

11. The semiconductor integrated circuit according to claim 1, wherein, when said memory core function block includes the DRAM, said DRAM includes word lines selected by a row address and bit lines selected by a column address, and said interface function block is adapted for said word lines or said bit lines of an optional length.

12. The semiconductor integrated circuit according to claim 11, wherein said interface function block is configured to automatically generate a refresh control signal inside without receiving any refresh control signal from an outside of said memory macro function block.

13. The semiconductor integrated circuit according to claim 11, further comprising:

a memory cell array including a plurality of DRAM cells arranged in rows and columns;

said word lines configured to be connected in common to said DRAM cells of the same row in said memory cell array;

said bit lines configured to be connected in common to said DRAM cells of the same column in said memory cell array; and a block selection circuit included in said address decoder portion and configured to output a block selection signal to divide said memory cell array into a plurality of blocks and to select at least one block in accordance with data of a plurality of predetermined bits in an address signal.

14. The semiconductor integrated circuit according to claim 13, wherein said test circuit is configured to activate said block selection signal outputted from said block selection circuit for all of said plurality of blocks during testing of a row-related circuit of said memory cell array.

15. The semiconductor integrated circuit according to claim 13, wherein said test circuit is configured to activate said block selection signal outputted from said block selection circuit for at least some of said plurality of blocks during testing of a row-related circuit of said memory cell array.

16. The semiconductor integrated circuit according to claim 1, wherein said interface function block is formed in a shape of a rectangular pattern.

17. The semiconductor integrated circuit according to claim 1, wherein said memory macro function block is composed of a plurality of circuit units whose layout patterns are polygons each including only right angles.

* * * * *